United States Patent [19]

Sturzebecher et al.

[11] Patent Number: 5,073,717
[45] Date of Patent: Dec. 17, 1991

[54] OPTICAL CONTROL OF A MICROWAVE SWITCH

[75] Inventors: Dana J. Sturzebecher, Tinton Falls; Arthur Paolella, Howell, both of N.J.

[73] Assignee: The United States of America as represented by the Secretary of the Army, Washington, D.C.

[21] Appl. No.: 604,082

[22] Filed: Oct. 15, 1990

[51] Int. Cl.[5] .............................................. G02B 27/00
[52] U.S. Cl. ............................... 250/551; 250/214 A; 307/311
[58] Field of Search .......... 250/551, 214 R, 214 S W, 250/227.11, 214 A; 307/311, 117; 455/602, 612, 617

[56] References Cited

U.S. PATENT DOCUMENTS

| | | | |
|---|---|---|---|
| 4,369,371 | 1/1983 | Hara et al. | 250/551 |
| 4,570,079 | 2/1986 | Davis | 250/551 |
| 4,859,965 | 8/1989 | Paolella et al. | 330/285 |
| 5,001,355 | 3/1991 | Rosen et al. | 250/551 |
| 5,012,084 | 4/1991 | Guiberteau et al. | 250/551 |

Primary Examiner—David C. Nelms
Assistant Examiner—Michael Messinger
Attorney, Agent, or Firm—Michael Zelenka; Robert A. Maikis

[57] ABSTRACT

An optical controlled switch circuit for controlling a two-way voltage driven microwave switch. The optical controlled switch circuit includes, a light source, a control connected to the light source, an optic fiber having an end coupled to the light source, a field effect transistor coupled to a second end of the optic fiber, an inverting dc amplifier means coupled to the field effect transistor, a non-inverting dc amplifier means coupled to the field effect transistor, and a two-way voltage driven microwave switch having signal inputs respectively coupled to the inverting dc amplifier means and to the non-inverting dc amplifier means and having a microwave input and having first and second microwave outputs.

5 Claims, 1 Drawing Sheet

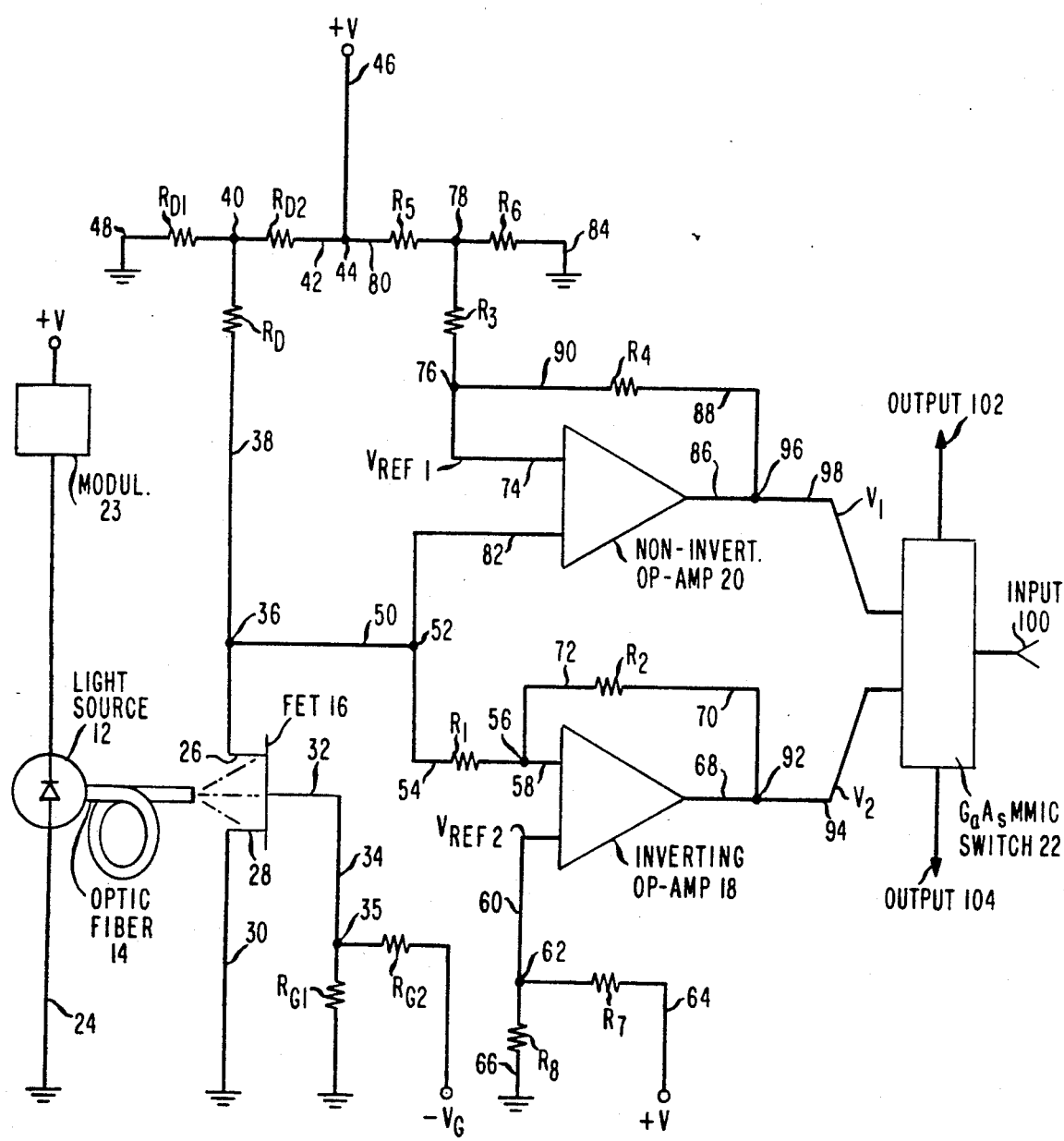

OPTICAL CONTROL OF A MICROWAVE SWITCH

GOVERNMENTAL INTEREST

The invention described herein may be manufactured, used, and licensed by or for the Government for governmental purposes without the payment to us of any royalty thereon.

FIELD OF THE INVENTION

The invention relates in general to an optical control of a voltage driven microwave switch, and particularly to an optical control of a two way voltage driven microwave switch.

BACKGROUND OF THE INVENTION

The prior art optical control is described in U.S. Pat. No. 4,859,965, issued Aug. 22, 1989. The prior art optical control includes a light source for emitting light at a wavelength in the region of 0.5 micrometers to 1 micrometer, control means coupled to said light source for controlling the intensity of the light emitted from sard source, a fixed resistance, a GaAs multi-finger FET having parallel connected sources and parallel connected drains and parallel connected gate fingers, circuit means for connecting the sources and drains of said FET in series circuit with said fixed resistance across a source of positive dc voltage, optic fiber means optically coupled from said light source on the surface of said FET between the sources and drains of the FET and covering substantially all of the gate fingers of the FET, gate biasing means coupled to the gates of said FET for biasing said FET to a point near pinch-off to maximize the light sensitivity of the FET, dc amplifier means having an input coupled to a circuit junction of said fixed resistance and said FET and having an output, a GaAs MMIC distributed amplifier having a dc bias control coupled to the output of the dc amplifier means, whereby changes in the intensity of light from said light source change the voltage drop across said FET and the input applied to said dc amplifier means to thereby change the gains of said MMIC distributed amplifier.

One problem with the prior art optical control is that it is not suitable for controlling a two way, voltage driven microwave switch.

SUMMARY OF THE INVENTION

According to the present invention, an optical control of a two-bit microwave switch is provided. This optical control comprises, a light source for emitting light at a wavelength in the region of 0.5 micrometers to 1 micrometer, control means coupled to said light source for controlling the intensity of the light emitted from said source, a fixed resistance, a GaAs multi-finger FET having parallel connected sources and parallel connected drains and parallel connected gate fingers, circuit means for connecting the sources and drains oil said FET in series circuit with said fixed resistance across a source of positive dc voltage, optic fiber means optically coupled from said light source on the surface of said FET between the sources and drains of the FET and covering substantially all of the gate fingers of the FET, gate biasing means coupled to the gates of said FET for biasing said FET to a point near pinch-off to maximize the light sensitivity of the FET, inverting dc amplifier means having an input coupled to a circuit junction of said fixed resistance and said FET and having an output, non-inverting dc amplifier means also having an input coupled to the circuit junction of said fixed resistance and said FET and having an output, a microwave switch having first and second inputs respectively coupled to the output of the inverting dc amplifier means and to the output of the non-inverting dc amplifier means and having a microwave input and having first and second microwave outputs, whereby changes in the intensity of light from said light source change the voltage drop across said FET and change the signal applied to said first dc amplifier means and the signal applied to said second dc amplifier means and then change the first and second signals applied to said microwave switch to thereby change the microwave input routed to the first or second microwave outputs.

By using the first and second dc amplifier means and the arrangement described, a suitable optical control is provided for controlling a two way, voltage driven microwave switch.

BRIEF DESCRIPTION OF THE DRAWINGS

These and other objects, features details of the invention will become apparent in light of the ensuing detailed disclosure, and particularly in light of the drawings wherein:

The figure is a schematic circuit diagram of an optically controlled switch circuit according to the present invention.

DESCRIPTION OF THE PREFERRED EMBODIMENT

As shown in the figure, an optically controlled switch circuit or assembly or system 10 is provided. Circuit 10 includes a light source or LED 12, an optic fiber 14, and an optical detector or gallium arsenide (GaAs) MESFET or microwave monolithic integrated circuit (MMIC) field effect transistor FET 16. Circuit 10 also includes an inverting dc operational amplifier 18, a non-inverting dc operational amplifier 20, and a GaAs MMIC microwave switch 22.

Light source 12 should emit light at a wavelength in the region of 0.5 micrometers to 1 micrometers because light in this wavelength region is capable of altering the performance of a GaAs FET. As illustrated in the figure, light source 12 may comprise a light emitting diode (LED), such as the pig-tailed LED manufactured by Laser Diode, Inc., No. IRE-160 FA, for example. This LED is capable of producing 300 microwatts of power at a wavelength of 835 nanometers. The intensity of the light from the LED 12 may be varied by a modulator 23, which acts as the control means for the optical control circuit of the invention.

Light source 12 is connected in series circuit with modulator 23 across a source V of positive dc voltage by means of a lead 24.

Optic fiber 14 is optically coupled to LED light source 12 and to a FET, indicated generally as 16. If the aforementioned pig-tailed LED is utilized as the light source, the pig-tail itself is an optic fiber and may be used as the optic fiber 14 in the circuit of the invention. This fiber is a multi-mode optic fiber with a core diameter of 100 micrometers and a cladding diameter of 140 micrometers. The FET 16 should be a GaAs multi-finger FET having parallel connected sources 28, parallel connected drains 26, and parallel connected gate fingers 32. A suitable FET, for example, would be NEC NE 868196 which has 14 gate fingers connected to a single gate bonding pad. The end of the optic fiber 14 which is coupled to FET 16 should focus the light from the source 12 on the active surface of the FET 16 between the sources and drains of the FET and the focus light spot should cover substantially all of the gate fingers of the FET.

The parallel connected drains 26 and parallel connected sources 28 of the FET 16 are connected in a series circuit. The parallel connected sources 28 connect through a lead 30 to ground. The parallel connected gates 32 connect through a lead 34 and a circuit junction 35 and a resistance $R_{G2}$ to a source $V_G$ of negative dc voltage which should be of sufficient magnitude to bias the FET 16 to a point near pinch-off of the FET 16. Pinch-off is usually defined as the value of gate voltage that causes the drain current of the FET to be at 10% of its full value. This is done to maximize the light sensitivity of the FET 16 because it has been found that the maximum change in operating performance of a GaAs FET in response to light directed onto the surface of the FET occurs at a point at or near pinch-off. Cares 32 are also connected to ground through the lead 34 circuit junction 35 and a resistance $R_{G1}$.

The parallel connected drains 26 connect through a circuit junction 36, a lead 38, a fixed resistance $R_D$, a circuit junction 40, a resistance $R_{D2}$, a lead 42, a circuit junction 44, and a lead 46 in that order, to a source of positive voltage $V_+$.

The circuit junction 40 between resistance $R_D$ and resistance $R_{D2}$ connects through a resistance $R_{D1}$ and a lead 48 to ground. Resistances $R_D$ and $R_{D2}$ are the drain biasing resistances.

The circuit junction 36 between the serially connected FET 16 and the fixed resistance $R_D$ is connected by means of a lead 50, a circuit junction 52, a lead 54, a resistance $R_1$, a circuit junction 56 and a lead 58 to the first input of the inverting dc operational amplifier 18.

The inverting operational amplifier 18 has its second input connected to a source of positive voltage +V by means of a lead 60, a circuit junction 62, a resistance $R_7$ and a lead 64. The input signal applied to the inverting operational amplifier 18 through resistance $R_1$ is essentially the drain to source voltage of the FET 16. Junction 62 connects through a resistance $R_8$ and a lead 66 to ground. The output of the inverting operational amplifier 18 is coupled in a feedback loop to its first input by means of lead 68, junction 92, a lead 70, a resistance $R_2$, a lead 72, a junction 56, and a lead 58. The gain of inverting amplifier 18 is determined by the resistances $R_1$ and $R_2$. The inverting dc operational amplifier 18 may comprise, for example, a GaAs or silicon operational amplifier, such as No. AD 840 JN which is manufactured by Analog Devices.

The non-inverting operational amplifier 20 has its first input connected to a source of positive voltage +V by means of a lead 74, a circuit junction 76, a resistance $R_3$, a circuit junction 78, a resistance $R_5$, a lead 80, junction 44, and the lead 46. The input signal applied to the second input of operational amplifier 20 through leads 50 and 82 is essentially the drain to source voltage of the FET 16. Junction 78 connects through a resistance $R_6$ and a lead 84 to ground. The output of the non-inverting operational amplifier 20 is coupled in a feedback loop to its first input by means of a lead 86, a circuit junction 96, a lead 88, a resistance $R_4$, a lead 90, circuit junction 76, and lead 74. The gain of non-inverting amplifier 20 is determined by the resistances $R_3$ and $R_4$. The non-inverting dc operational amplifier 20 may comprise the same part as that of the inverting dc operational amplifier 18.

Microwave switch 22 connects to the output of the inverting dc operational amplifier 18 through lead 68, circuit junction 92 and a lead 94. Microwave switch 22 connects to the output of the non-inverting dc operational amplifier 20 through lead 86, circuit junction 96, and a lead 98. Leads 94 and 98 are in the form of a microstrip transmission line. Microwave switch 22 also has a microwave input 100, a first microwave output 102, and a second microwave output 104. Non-inverting dc operational amplifier 20 has a first reference voltage $V_{REF1}$, which is provided by voltage divider resistances $R_5$ and $R_6$. Resistances $R_3$ and $R_4$ provide the voltage gain. Inverting dc operational amplifier 18 has a second reference voltage $V_{REF2}$, which is provided by resistances $R_7$ and $R_8$. Resistances $R_1$ and $R_2$ provide voltage gain. Lead 98 provides a voltage $V_1$ from op-amp 20 to switch 22. Lead 94 provides a voltage $V_2$ from op-amp 18 to switch 22. Switch 22 may comprise a switch manufactured by M/A COM, as Part No. MA 4 GM 262-500.

In operation, circuit 10 operates in the following manner. The MESFET optical detector 16 is brased at pinch-off. The biasing to the gate circuit is provided by resistances $R_{G1}$ and $R_{G2}$. The ratio is set such that the FET 16 is at pinch-off, which is at a gate-to-source voltage equal to −3.75 volts, in this embodiment. The biasing to the drain circuit is provided by resistances $R_{D1}$ and $R_{D2}$. The ratio is such that at pinch-off the drain-to-source voltage YDS) is 3.0 volts. Under optical illumination, the device begins to conduct current through resistance $R_D$ and the required change in drain-to-source voltage ($V_{DS}$) of −0.5 volts is achieved. The optical source 12 used to illuminate the FET 16 is a LED operating at a peak wavelength of 835 nm. The light is coupled through the multi-mode fiber 14 with core-cladding diameters of 100 and 140 mm respectively. The optical power needed to provide the 0.5 volt change is only 25 uw. The drain of the FET 16 is connected to the high speed inverting operation al amplifier 18 and the non-inverting operation al amplifier 20. Each o the amplifiers 18, 20 has a voltage gain of 14 (23 dB). Each op-amp 18 and 20 is in a 14 pin package, and has a gain-bandwidth product of 400 MHz. Biasing is provided by 9.0 and −9.0 volt supplies. The non-inverting op-amp 20 has a reference voltage $V_{REF1}$=3.0 provided by divider resistances $R_5$ and $R_6$. Resistances $R_3$ and $R_4$ provide voltage gain. When there is no illumination, $V_{DS}$=3.0 volts, and the difference in the input voltage of the non-inverting op-amp 20 is 0.0 volts, therefore, the output voltage $V_1$ is 0.0 volts. The inverting op-amp 18 has a reference voltage of $V_{REF2}$=2.5 volts provided by resistances $R_7$ and $R_8$. Gain for he inverting op-amp 18 is set by resistances $R_1$ and $R_2$. Again with $V_{DS}$=3.0 volts, a difference of 0.5 volts is at the input of the inverting op-amp 18. The gain is such tat the output $V_2$ is −7.0 volts. With these conditions, the first output 102 is in the low loss state, as the second output 104 is in the isolation state.

When the FET 16 is illuminated, $V_{DS}$ changes from 3.0 to 2.5 volts and the outputs of the op-amps 18, 20, switch states. The voltage difference at the inverting op-amp input is not 0.0 volts, and the voltage difference at non-inverting op-amp input is now −0.5. the voltage $V_1$ changes from 0.0 to −7.0 volts and the voltage $V_2$ changes from −7.0 to 0.0 volts, thus switching the microwave signal from first output 102, now the isolation state, to second output 104, now the low loss state. In this embodiment, control circuit 10, when tested alone, was able to switch states at a rate of 10 MHz or 100 ns. This rate was limited by modulator 23, which was driving circuit 10.

The advantages of circuit 10 are indicated hereafter.

A) The circuit 10 can be used for high speed switching.

B) The circuit 10 can optically control a microwave switch 22 which is a GaAs MMIC switch.

C) The circuit 10 can be used for remotely controlling a microwave switch 22 in a relatively high interference environment.

D) The circuit 10 can be used to control a microwave switch 22 using a fiber optic link.

While the invention has been described in its preferred embodiment, it is to be understood that the words which have been used are words of description rather than limitation and that changes may be made within the purview of the appended claims without departing from the true scope and spirit of the invention in its broader aspects.

For example, the LED light source 12 can be replaced by a high speed laser for faster switching. As another example, instead of use as a microwave switch, by combining switches one could make an optically controlled microwave multiplexer, or amplifier, or attenuator, or phase shifter, or circulator by using switched like techniques. Where a switched like technique would mean to optically control the path of the microwave signal through microwave switches (i.e. microwave multiplexer) through either an amplifier or attenuator with predetermined gain or loss (i.e. amplifier, attenuator) or a certain length of line (i.e. phase shifter), or a certain path one would like the microwave signal to flow (i.e. circulator).

What is claimed is:

1. An optical controlled switch circuit comprising:
   a light source for emitting light at a wavelength in the region of 0.5 micrometers to 1.0 micrometer;
   control means coupled to said light source for controlling the intensity of the light emitted from said source;
   a fixed resistance;
   a GaAs multi-finger FET having parallel connected sources and parallel connected drains and parallel connected gate fingers;
   circuit means for connecting the sources and drains of said FET in series circuit with said fixed resistance across a source of positive dc voltage;
   means optically coupled from said light source on the surface of said FET between the sources and drains of the FET and covering substantially all of the gate fingers of the FET;
   gate biasing means coupled to the gates of said FET for biasing said FET to a point near pinch-off to maximize the light sensitivity of the FET;
   inverting dc amplifier means having an input coupled to a circuit junction of said fixed resistance and said FET and having an output and having another input for receiving a reference voltage;
   non-inverting dc amplifier means having an input coupled to said circuit junction of said fixed resistance and said FET and having an output and having another input for receiving a reference voltage;
   a two-way voltage driven microwave unit having an input coupled to the output of the inverting dc amplifier means and another input coupled to the output of the non-inverting dc amplifier means and having a microwave input and having a first microwave output and having a second microwave output, whereby changes in the intensity of light from said light source change the voltage drop across said FET and change the signals applied to said inverting dc amplifier means and to said non-inverting dc amplifier means and change the signals applied to said microwave unit to thereby route its microwave input to one or the other of its microwave outputs.

2. The optical controlled switch circuit of claim 1, wherein said two-way voltage driven microwave unit is a GaAs MMIC microwave switch.

3. The optical controlled switch circuit of claim 1, wherein said control means is a modulator.

4. The optical controlled switch circuit of claim 1, wherein said means optically coupled to said light source and said FET for focusing light from said light source on the surface of said FET is an optic fiber.

5. The optical controlled switch circuit of claim 1, wherein said light source is a LED.

* * * * *